(12) United States Patent
Yang et al.

(10) Patent No.: US 8,068,342 B2
(45) Date of Patent: Nov. 29, 2011

(54) COVER MECHANISM AND ELECTRONIC DEVICE USING SAME

(75) Inventors: Mu-Wen Yang, Taipei Hsien (TW); Chih-Chiang Chang, Taipei Hsien (TW); Zheng Shi, Shenzhen (TW)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 466 days.

(21) Appl. No.: 12/339,245

(22) Filed: Dec. 19, 2008

(65) Prior Publication Data

US 2009/0314044 A1 Dec. 24, 2009

(30) Foreign Application Priority Data

Jun. 23, 2008 (CN) .......................... 2008 1 0302277

(51) Int. Cl.
*H05K 7/12* (2006.01)

(52) U.S. Cl. ............................ 361/726; 361/732; 70/158
(58) Field of Classification Search .................. 361/732, 361/679.56, 679.55, 679.58, 679.02; 455/575.1–575.4; 70/158
See application file for complete search history.

(56) References Cited

U.S. PATENT DOCUMENTS 6,057,055 A * 5/2000 Kumagawa ..................... 429/97
2008/0063928 A1* 3/2008 Lin ................................ 429/97

* cited by examiner

*Primary Examiner* — Jinhee Lee
*Assistant Examiner* — Ingrid Wright
(74) *Attorney, Agent, or Firm* — Altis Law Group, Inc.

(57) ABSTRACT

An electronic device using a cover mechanism to cover a hole is described. The cover mechanism includes a locking member slidably mounted on a base member and a cover member. The cover member can be locked to the base member by locking of the cover member to the locking member in a locked position, can rotate around the locking member in a released position, and can expose the hole and physically attach to the locking member in an opened position.

18 Claims, 5 Drawing Sheets

COVER MECHANISM AND ELECTRONIC DEVICE USING SAME

CROSS-REFERENCE TO RELATED APPLICATIONS

This application is related to co-pending U.S. patent application Ser. No. 12/339,241, entitled "COVER MECHANISM AND ELECTRONIC DEVICE USING SAME", by Mu-Wen Yang et al. Such applications have the same assignee as the present application and have been concurrently filed herewith. The above-identified applications are incorporated herein by reference.

BACKGROUND OF THE INVENTION

1. Field of the Invention

The exemplary embodiment relates to cover mechanisms used in electronic devices.

2. Description of Related Art

Electronic devices usually have external interfaces (e.g., universal serial bus (USB)) for electrically connecting peripheral devices (e.g., printers), accessories (e.g., USB flash drives) or other electronic devices. Such external interfaces should be protected by cover mechanisms from e.g., dust or water, to maintain proper functioning.

The cover mechanisms usually include covers with locks. The covers are typically locked to the electronic devices by latches to cover the area through which the interfaces of electronic devices are exposed. However, the covers are often not permanently attached to the electronic device. Thus, the covers may easily be misplaced or lost when not locked to the electronic devices.

Therefore, there is room for improvement within the art.

BRIEF DESCRIPTION OF THE DRAWINGS

Many aspects of the exemplary cover mechanism and electronic device using the cover mechanism can be better understood with reference to the following drawings. These drawings are not necessarily drawn to scale, the emphasis instead being placed upon clearly illustrating the principles of the exemplary cover mechanism and the electronic device. Moreover, in the drawings like reference numerals designate corresponding parts throughout the several views. Wherever possible, the same reference numbers are used throughout the drawings to refer to the same or like elements of an embodiment.

DETAILED DESCRIPTION OF THE EMBODIMENTS

Figure 1:
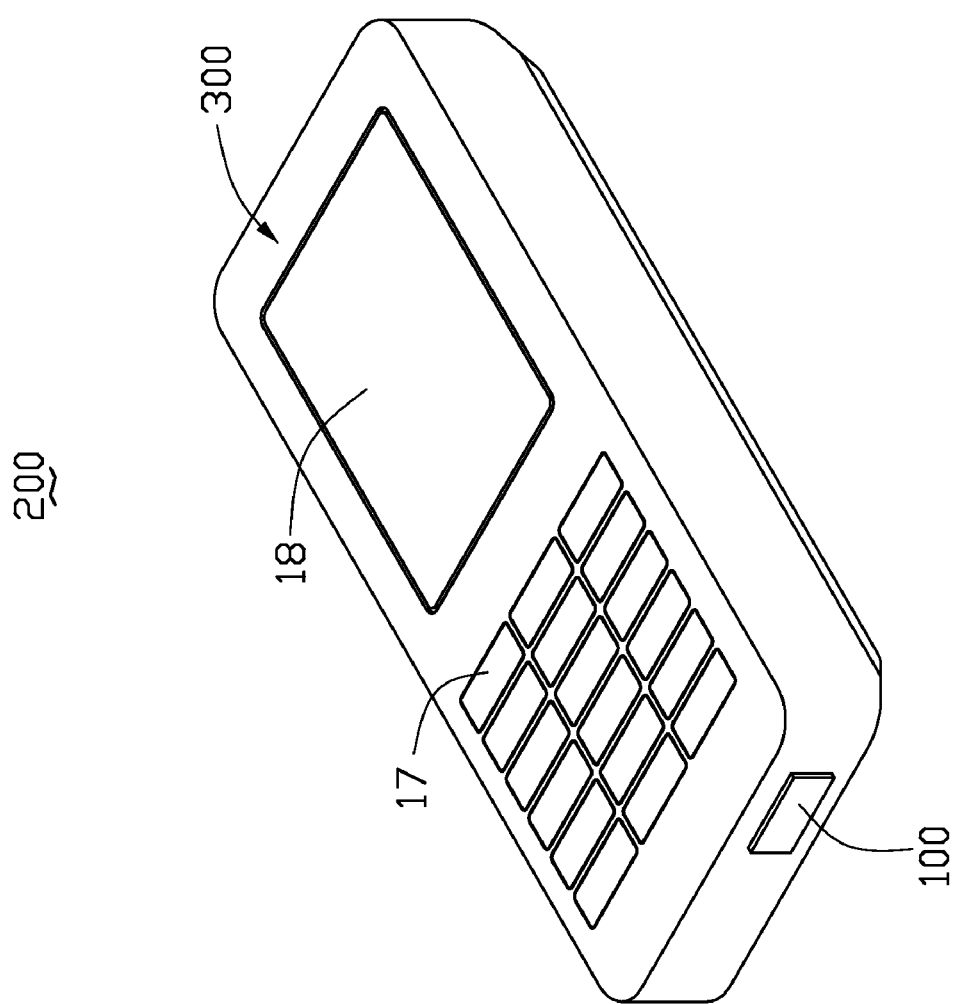
FIG. 1 is an isometric view of an electronic device including an exemplary cover mechanism.

FIG. 1 shows an exemplary electronic device 200 (such as a mobile phone) including an enclosed housing 300, a keypad 17, a display 18, and a cover mechanism 100.

Figure 2:
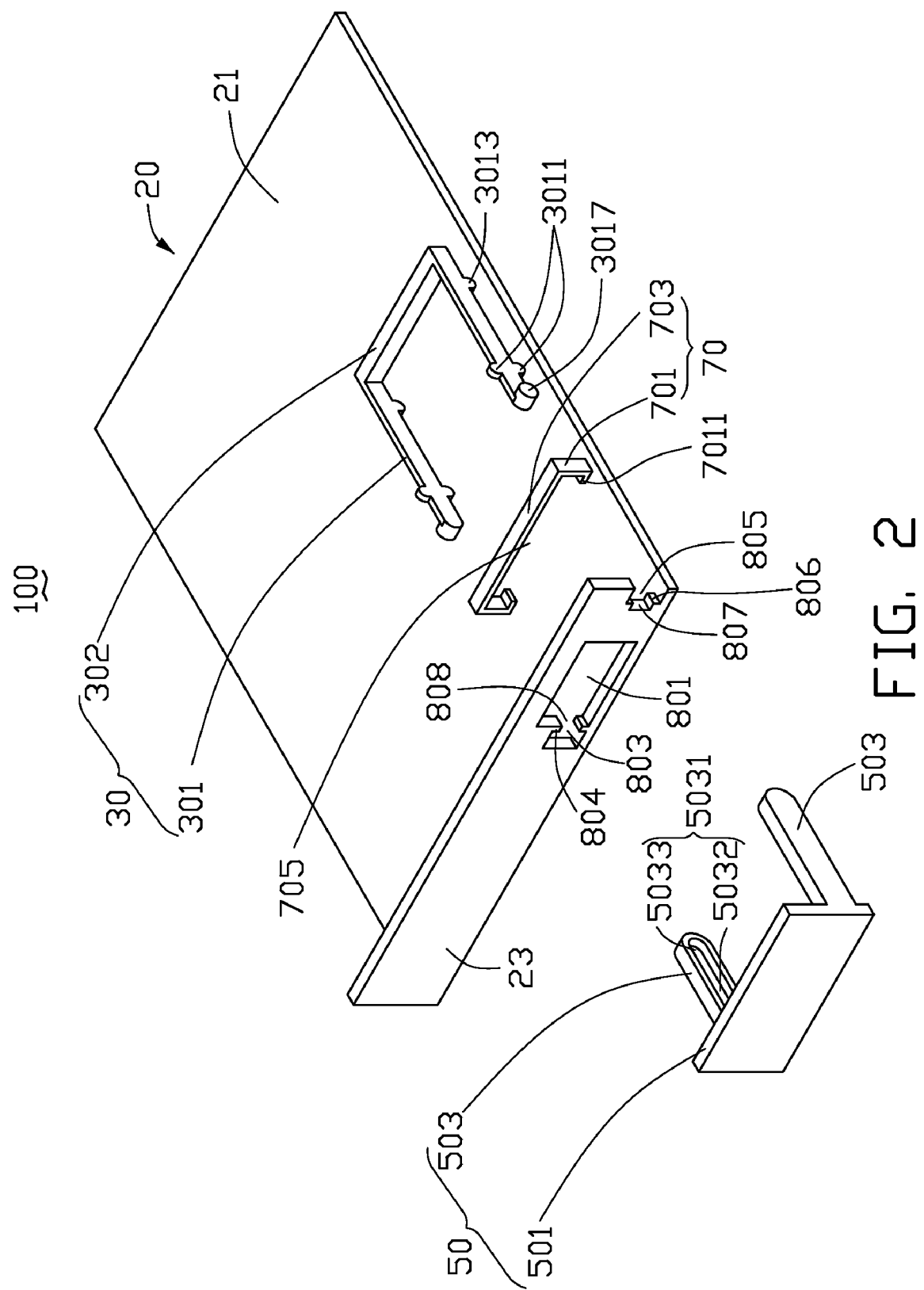
FIG. 2 is an exploded and isometric view of the cover mechanism shown in FIG. 1.

Referring to FIG. 2, the cover mechanism 100 includes a base member 20, a locking member 30, and a cover member 50. The base member 20 may be portions of the housing 300 and includes a bottom wall 21 and a sidewall 23 perpendicular to the bottom wall 21. The cover member 50 may be locked by the locking member 30 to the base member 20 and cover a hole 801 (e.g., a connector interface hole) defined in the sidewall 23.

A portion of the sidewall 23 defines a rectangular cutout 803, a rectangular gap 808, a rectangular first notch 805, and a rectangular second notch 807. The gap 808 is located between and communicates with the cutout 803 and the hole 801. Since the cutout 803 is larger than the gap 808, two opposite first blocks 804 that face each other are formed in the portion of the sidewall 23 defining the cutout 803 and the gap 808.

The first notch 805 is located outside and communicates with the second notch 807. The first notch 805 and the second notch 807 are defined in a portion of the sidewall 23 near the hole 801. Since the first notch 805 is larger than the second notch 807, two opposite second blocks 806 that face each other are formed in the portion of the sidewall 23 defining the first notch 805 and the second notch 807.

The locking member 30 is frame-shaped including two parallel locking arms 301 and a connecting body 302. As will now be described, the locking arms 301 are configured to partially move through the gap 808 and the second notch 807.

Each locking arm 301 includes two first blocking portions 3011, a second blocking portion 3013, and a pivoting portion 3017. The second blocking portion 3013 protrudes from the locking arm 301 towards bottom wall 21, and adjacent to the connecting body 302. The pivoting portion 3017 protrudes from a distal end of the locking arm 301. The two first blocking portions 3011 protrude from the locking arm 301, both towards and away from the bottom wall 21, and adjacent to the pivoting portion 3017. The first blocking portions 3011 are configured to abut the first blocks 804 and the second blocks 806.

The bottom wall 21 supports a frame-shaped limiting member 70 defining a receiving space 705 configured for slidably receiving the locking member 30. The limiting member 70 may include two L-shaped first limiting portions 701 and a straight second limiting portion 703. The second limiting portion 703 is located between and connects the first limiting portions 701. Each first limiting portion 701 may have a third block 7011 extending towards a center of the limiting member 70. The third block 7011 can be secured (e.g., by hot-melting) to the surface of the bottom wall 21.

The cover member 50 includes a cover portion 501 and two elastic positioning arms 503. The cover portion 501 is configured to cover the hole 801 when the cover member 50 locks to the base member 20.

The positioning arms 503 may be made of rubber, soft plastic or other elastic materials. The positioning arms 503 protrude parallelly outward from an inner surface of the cover portion 501. Each positioning arm 503 defines a positioning groove 5031, and the two positioning grooves 5031 face towards each other. The positioning groove 5031 extends along the length of the positioning arm 503. The positioning groove 5031 corresponds to the pivoting portion 3017, i.e., the pivoting portion 3017 can be received and slide within the positioning groove 5031. The positioning groove 5031 defines a rectangular positioning section 5032 and a pivoting section 5033. The positioning section 5032 extends along the length of the positioning arm 503, and the pivoting section 5033 communicates with the positioning section 5032 distal to the cover portion 501. The width of the positioning section 5032 is slightly smaller than the diameter of the pivoting portion 3017 The pivoting portion 3017 has the substantially same size and shape as the pivoting section 5033, and thus can pivot within the pivoting section 5033.

Figure 3:
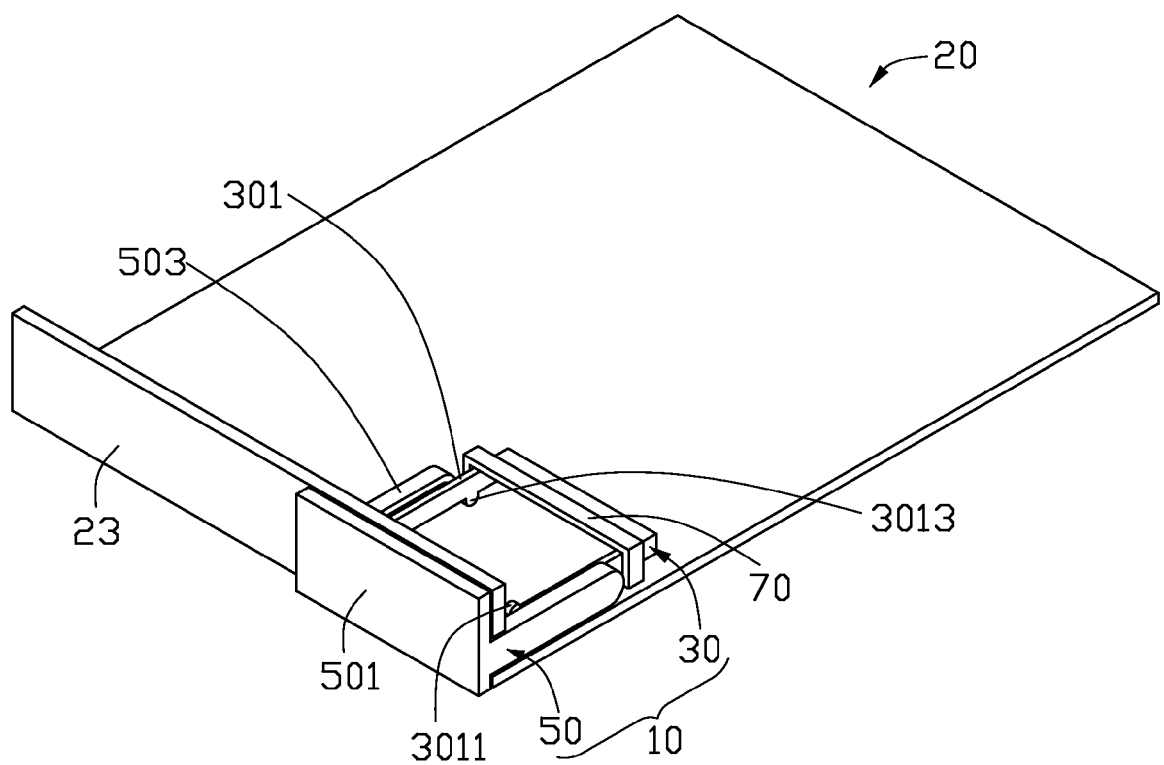
FIG. 3 is an isometric view of the cover mechanism shown in FIG. 1 in a locked position.

In FIG. 3, the cover mechanism 100 is in a locked position and the cover portion 501 covers the hole 801. The cover member 50 locks to the locking member 30 and the base member 20. To achieve this locking, the pivoting portion 3017 can be inserted into the positioning section 5032. At this time, because the width of the positioning section 5032 is slightly smaller than the diameter of the pivoting portion 3017, the pivoting portion 3017 slightly spreads interior walls of the positioning portion 3017. In such case, a slight resilient deformation exists in the positioning section 5032. Therefore, the pivoting portion 3017 can be frictionally secured within the positioning section 5032. In this position, the first blocking portions 3011 are spaced from the sidewall 23. The second blocking portions 3013 position between the sidewall 23 and the third blocks 7011, and abut the third blocks 7011.

Figure 4:
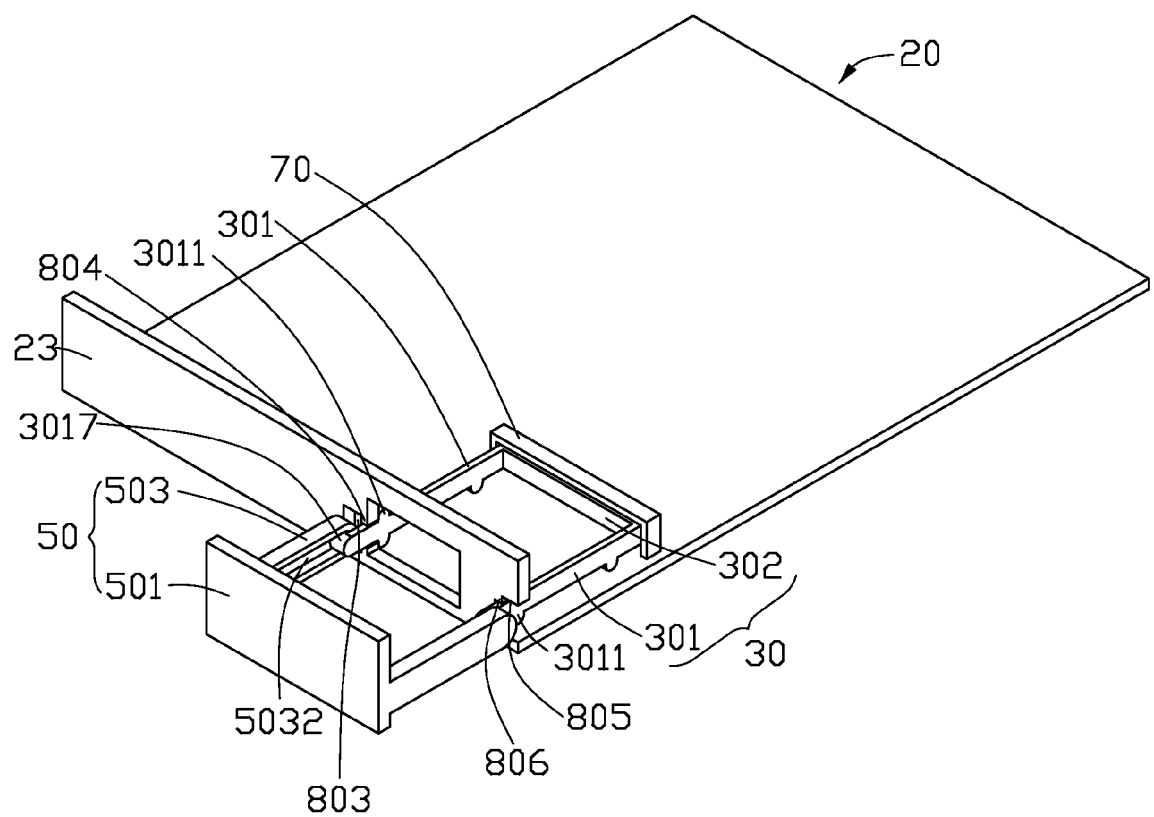
FIG. 4 is similar to FIG. 3, but in a released position.
Figure 5:
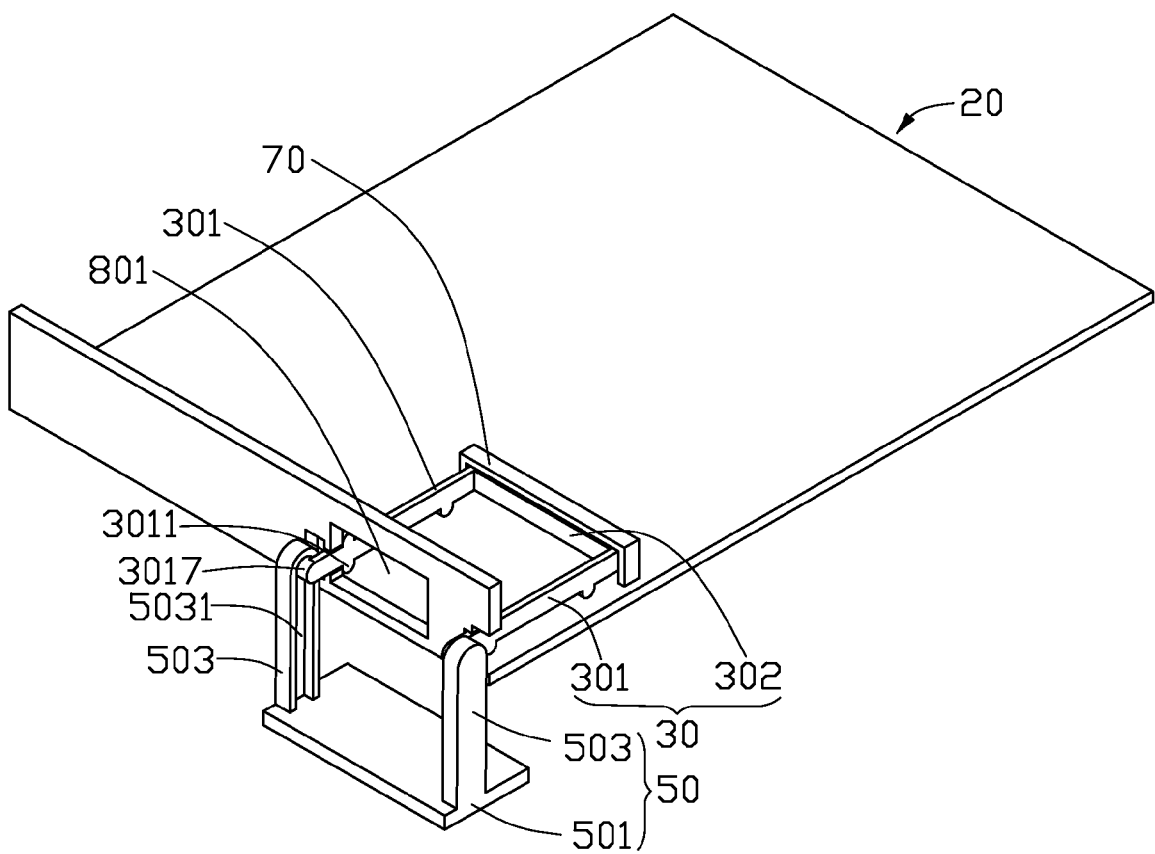
FIG. 5 is similar to FIG. 4, but in an opened position.

FIGS. 4 and 5 show a process of releasing the locking of the cover member 50 and the base member 20, from the locked position to a released position, and further to an opened position. In FIG. 4, the cover member 50 is pulled outwardly along the longitudinal axis of the locking member 30 to the released position. During this stage, the positioning arms 503 and the pivoting portion 3017 move until the first blocking portions 3011 abut the first blocks 804 and the second blocks 806. This movement exposes the pivoting portions 3017 out of the cutout 803 and the first notch 805. By the abutting of the first blocking portions 3011 with the first blocks 804 and the second blocks 806, the pivoting portions 3017 cannot move any further. Therefore, further pulling of the cover member 50 causes the positioning arms 503 to move relative to the pivoting portions 3017. That is, the pivoting portions 3017 slide within the positioning section 5032 into the pivoting section 5033. At this time, the locking of the cover member 50 and the base member 20 is released.

FIG. 5 shows the cover member 50 pivoting into the opened position to expose the hole 801. During this stage, the positioning arms 503 can pivot around the pivoting portions 3017. In other words, the pivoting portions 3017 can pivot freely within the pivoting sections 5033.

In addition, the engaging of the pivoting portions 3017 into the pivoting sections 5033 prevents the cover member 50 from separating from the locking member 30 and the base member 20.

To close the cover mechanism 100, the above process is reversed and the cover member 50 moved from the open position to the released position and then to the locked position. The closing process ends when the third blocks 7011 abut the second blocking portions 3013 (see FIGS. 2 and 3).

It is to be understood, however, that even through numerous characteristics and advantages of the exemplary invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cover mechanism for covering a hole of an electronic device, the cover mechanism comprising:
   a base member;
   a locking member slidably mounted on the base member, the locking member comprises two locking arms;
   a cover member comprising two elastic positioning arms, and the positioning arms configured for being deformed to be secured to the locking arms, the cover member configured for movement between:
   a locked position, where the cover member is locked to the base member by locking of the cover member to the locking member;
   a released position, where the cover member can rotate around the locking member; and
   an opened position, where the cover member expose the hole while being physically attached to the locking member.

2. The cover mechanism as claimed in claim 1, wherein:
   the two locking arms each comprises a positioning groove, the positioning groove includes a positioning section;
   the locking arms each comprises a pivoting portion; and
   the pivoting portion being configured for being frictionally secured within the positioning section by causing a slightly resilient deformation of the positioning section.

3. The cover mechanism as claimed in claim 2, wherein the positioning groove further comprises a pivoting section communicating with the positioning section, the pivoting portion being further configured for pivoting within the positioning section, and the positioning arms configured for rotating around the pivoting portion.

4. The cover mechanism as claimed in claim 3, wherein the cover member further comprises a cover portion located between and connecting the positioning arms, the cover portion being configured for covering the hole.

5. The cover mechanism as claimed in claim 3, wherein the locking member further comprises a connecting body located between and connecting the locking arms.

6. The cover mechanism as claimed in claim 3, wherein the locking member is configured for sliding relative to the base member between the locked position and the released position.

7. The cover mechanism as claimed in claim 6, wherein:
   the base member comprises a sidewall, the hole defined through the sidewall, the sidewall forming a pair of first blocks facing each other and a pair of second blocks facing each other in the sidewall; and
   the locking member further comprises two first blocking portions configured for being blocked by the first block and the second block from the locked position to the released position.

8. The cover mechanism as claimed in claim 7, wherein:
   the base further comprises a bottom wall and a limiting member formed on the bottom wall; and
   the locking member further comprises a second blocking portions configured for being blocked by the limiting member from the released position to the locked position.

9. The cover mechanism as claimed in claim 8, wherein:
   the limiting member is a partially enclosed frame-shaped comprising two first limiting portions and a second limiting portions connecting the first limiting portions;
   the first limiting portions including third blocks configured for blocking the second blocking portions; and
   the second limiting portions configured for limiting the locking member away from the bottom wall.

10. An electronic device, comprising:
    a housing defining an hole;
    a cover mechanism, comprising:
    a base member being portions of the housing;
    a locking member slidably mounted on the base member, the locking member comprises two locking arms;
    a cover member comprising two elastic positioning arms, and the positioning arms configured for being deformed to be secured to the locking arms, the cover member configured for movement between:

a locked position, where the cover member is locked to the base member by locking of the cover member to the locking member;

a released position, where the cover member can rotate around the locking member; and an opened position, where the cover member expose the hole while being physically attached to the locking member.

11. The electronic device as claimed in claim 10, wherein:
the two locking arms each comprises a positioning groove, the positioning groove includes a positioning section;
the locking arms each comprises a pivoting portion; and
the pivoting portion being configured for being frictionally secured within the positioning section by causing a slightly resilient deformation of the positioning section.

12. The electronic device as claimed in claim 11, wherein the positioning groove further comprises a pivoting section communicating with the positioning section, the pivoting portion being further configured for pivoting within the positioning section, and the positioning arms configured for rotating around the pivoting portion.

13. The electronic device as claimed in claim 12, wherein the cover member further comprises a cover portion located between and connecting the positioning arms, the cover portion being configured for covering the hole.

14. The electronic device as claimed in claim 12, wherein the locking member further comprises a connecting body located between and connecting the locking arms.

15. The electronic device as claimed in claim 12, wherein the locking member is configured for sliding relative to the base member between the locked position and the released position.

16. The electronic device as claimed in claim 15, wherein:
the base member comprises a sidewall, the hole defined through the sidewall, the sidewall forming a pair of first blocks facing each other and a pair of second blocks facing each other in the sidewall; and
the locking member further comprises two first blocking portions configured for being blocked by the first block and the second block from the locked position to the released position.

17. The electronic device as claimed in claim 16, wherein:
the base further comprises a bottom wall and a limiting member formed on the bottom wall; and
the locking member further comprises a second blocking portions configured for being blocked by the limiting member from the released position to the locked position.

18. The electronic device as claimed in claim 17, wherein:
the limiting member is a partially enclosed frame-shaped comprising two first limiting portions and a second limiting portions connecting the first limiting portions;
the first limiting portions including third blocks configured for blocking the second blocking portions; and
the second limiting portions configured for limiting the locking member away from the bottom wall.

* * * * *